United States Patent [19]
Roy

[11] Patent Number: 6,004,188
[45] Date of Patent: Dec. 21, 1999

[54] METHOD FOR FORMING COPPER DAMASCENE STRUCTURES BY USING A DUAL CMP BARRIER LAYER

[75] Inventor: Sudipto Ranendra Roy, Spring Grove, Singapore

[73] Assignee: Chartered Semiconductor Manufacturing Ltd., Singapore, Singapore

[21] Appl. No.: 09/151,153

[22] Filed: Sep. 10, 1998

[51] Int. Cl.[6] ...................................................... B24B 1/00
[52] U.S. Cl. ............................................... 451/41; 451/57
[58] Field of Search ................................ 451/37, 41, 57, 451/59, 53, 28, 29, 285, 286, 287, 289

[56] References Cited

U.S. PATENT DOCUMENTS

| | | | |
|---|---|---|---|
| 3,662,501 | 5/1972 | Mendel | 451/37 |
| 3,750,341 | 8/1973 | Matthews, Jr. et al. | 451/78 |
| 4,549,374 | 10/1985 | Basi et al. | 451/41 |
| 5,069,002 | 12/1991 | Sandhu et al. | 451/1 |
| 5,136,819 | 8/1992 | Takagi et al. | 451/51 X |
| 5,676,587 | 10/1997 | Landers et al. | 451/57 |
| 5,677,244 | 10/1997 | Venkatraman | 437/198 |
| 5,705,430 | 1/1998 | Avanzino et al. | 437/195 |
| 5,723,387 | 3/1998 | Chen | 438/692 |
| 5,731,245 | 3/1998 | Joshi et al. | 438/705 |
| 5,736,192 | 4/1998 | Okamoto | 427/99 |
| 5,739,579 | 4/1998 | Chiang et al. | 257/635 |
| 5,795,495 | 8/1998 | Meikle | 451/41 X |
| 5,916,011 | 6/1999 | Kim et al. | 451/57 X |

Primary Examiner—David A. Scherbel
Assistant Examiner—Anthony Ojini
Attorney, Agent, or Firm—George O. Saile; Rosemary L.S. Pike

[57] ABSTRACT

An improved and new method for forming dual damascene CMP of copper lines and interconnects(studs) using a dual CMP barrier layer. The two layer polishing barrier produces planar copper structures and solves dishing problems caused when the soft exhibits to a high polishing rate relative to the surround material. The polishing barrier layers consist of bottom layer of TiN with a layer of Ta or TaN on top of TiN layer. The top layer has a low polishing and the bottom layer has high polishing similar to the polishing of copper. Dishing of the copper lines and interconnects is avoided by the method. The result is better uniformity across the substrate and better electrical performance due to the increased copper line cross-sectional.

16 Claims, 3 Drawing Sheets

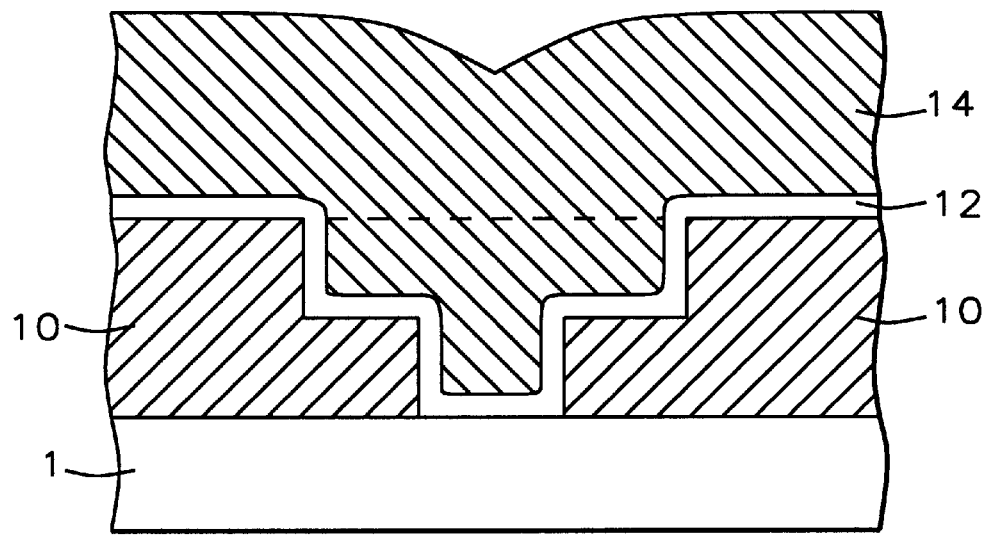
*FIG. 1a - Prior Art*
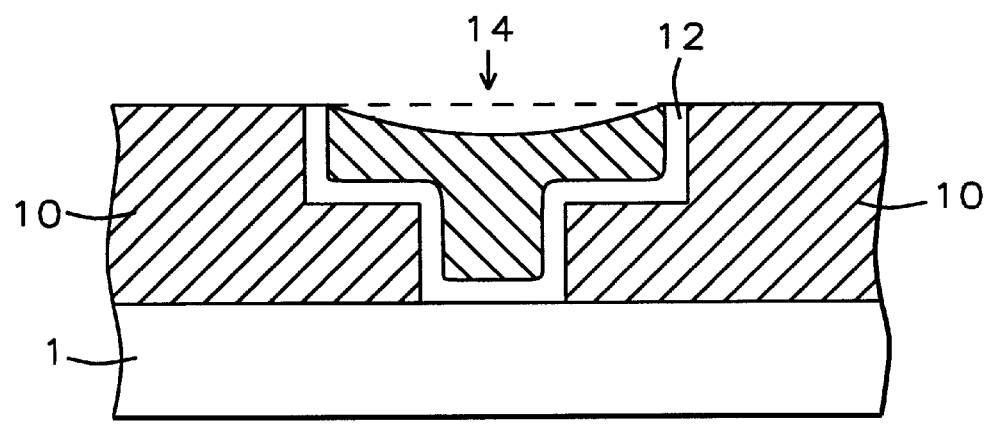
*FIG. 1b - Prior Art*

METHOD FOR FORMING COPPER DAMASCENE STRUCTURES BY USING A DUAL CMP BARRIER LAYER

BACKGROUND OF THE INVENTION (1) Field of the Invention

This inventions relates to a method of fabrication used in the semiconductor integrated circuit devices, and more specifically to the formation of planarized structures of conducting copper lines and interconnects using the CMP (Chemical Mechanical Polish) dual damascene technique with a unique double CMP barrier layer.

(2) Description of Related Art

In the fabrication of semiconductor integrated circuits CMP (Chemical Mechanical Polish) is used to remove conducting metal in a dual damascene process. Conducting metal is inlaid into trench and via structures of insulating material. The trenches and vias are usually filled with copper and the insulating material is typically insulating oxide defined by photo lithography.

The CMP process polishes back the excess copper and any surrounding material at the same time. Key to the process is the polishing rate of copper and the surrounding material. The softer copper metal typically polishes back at a faster rate than the surrounding material causing dishing in the copper structures. This lack of planarity caused by different CMP polishing rates among different materials presents a challenge to the Semiconductor Industry. Ideally, the CMP polishing rate of copper and that of the surrounding material should be, such that copper is polished without any dishing, while also removing the barrier layers, and stopping on insulating layer without removing the insulating layer.

U.S. Pat. No. 5,736,192 entitled "Embedded Electroconductive Layer and Method for Formation Thereof" granted Apr. 7, 1998 to Shigeru Okamoto describes a method of forming a copper interconnect using a TiN layer to aid in the CVD deposition of copper. A diffusion barrier layer for copper is listed as a TaN or WN layer. The embedded copper is patterned by a damascene CMP process.

U.S. Pat. No. 5,731,245 entitled "High Aspect Ratio Low Resistivity Lines/Vias with Tungsten-Germanium Alloy Hard Cap" granted Mar. 24, 1998 to Rajiv Vassant Joshl, et al, shows a CMP process for a copper layer using a hard CMP stopping layer. The invent teaches that copper or Al-Cu layer, in a trench or via fill process, is capped by a refractory metal. A layer of W-Ge is deposited over the refractory material layer and metallization. The hard, wear-resistant W-Ge layer acts as a polishing stop, in alumina slurry or ferric nitrate CMP.

U.S. Pat. No. 5,676,587 entitled "Selective Polish Process For Titanium, Titanium Nitride, Tantalum and Tantalum Nitride" granted Oct. 14, 1997 to William Francis Landers, et al, describes CMP method whereby W or Cu is removed by a two-step CMP process from an oxide layer. The damascene method uses an underlying Ti/TiN or Ta/TaN via liner layer, which protects the underlying oxide layer. This underlying layer is selectively removed in step two, of the two-step CMP process, by utilizing a neutral pH silica based slurry.

U.S Pat. No. 5,739,579 entitled "Method for Forming Interconnections for Semiconductor Fabrication and Semi-Conductor Device Having Such Interconnections" granted Apr. 14, 1998 to Chien Chiang and David B. Fraser describes multilayer interconnects (plugs) and conducting lines formed by CMP. Copper metal is surrounded by diffusion barrier layer of titanium nitride and silicon oxynitride. Silicon nitride is used as a key etch stop on top oxide for CMP process.

U.S. Pat. No. 5,705,430 granted Jan. 6, 1998 to Steven Avanzino, et al, teaches a method of improving a dual CMP damacene process by forming the conductive lines and conductive vias with two etch steps of an insulating layer that produces sharply defined edges of the via openings.

U.S. Pat. No. 5,677,244 to Venkatraman describes a dual damascene structure that utilizes a copper diffusion barrier layer and seed layer combined. CVD copper is used for the conducting lines and vias and removed by CMP. Barrier layer material lists Ti, TiN, Cu and Al.

U.S. Pat. No. 5,723,387 to Chen describes a method and apparatus for forming Cu interconnect metallurgy on semiconductor substrates. A self contained unit for forming Cu metallurgy interconnection structures is described, which reduces the number of times wafers are transferred between wet process stations.

SUMMARY OF THE INVENTION

It is the general object of the present invention to provide an improved method of forming an integrated circuit in which a special dual damascene process forms planar copper lines and interconnects (studs) using CMP without dishing of the copper structures.

A more specific object of the present invention is to provide an improved method of forming an integrated circuit in which a dual CMP barrier layer is used to control the CMP process to form planarized copper lines and interconnects.

A further object of the present invention is the removal of the unique dual CMP barrier layer from the surface without residual film left.

In accordance with the objects of the invention a new method of forming improved metal lines and interconnects (studs) in a efficient dual damascene CMP process is achieved.

In the convention method of dual damascene, insulator is patterned using two photo lithography masking steps and two etch steps to first form the contact vias and then the trenches. However, in this process a special CMP barrier layer and trench insulator opening are patterned together.

First the insulating layer is deposited on a substrate. In one embodiment of this invention, substrate is any general underlying material. In another embodiment of this invention, substrate is to mean a multi-level metal structure. In yet another embodiment of this invention, substrate is a semiconductor surface with a diffusion contact. Hence, three embodiments are general substrate, multi-level metal, and a semiconductor diffusion contact.

After the insulating layer is deposited, a thin layer of TiN, titanium nitride is deposited. The TiN is the first layer of the important dual layer CMP barrier to be deposited and patterned. The TiN is patterned together with the insulating layer, as was stated above. The TiN is patterned so that the dual damascene pattern is open to form the via holes and open to form trench areas.

Next the second layer of the dual CMP barrier layer is deposited. This layer consists of Ta or TaN and is deposited Next copper metal is deposited by methods that achieve good via and trench fill properties.

The novel features of the dual CMP barrier layer are that the first step of the CMP removes excess Cu and TaN or Ta and the second step of CMP process removes the TiN film which planarizes the copper structure, removing dishing. In the first step of the CMP, the TiN acts as buffer layer. The Ta and TaN layer polish much slower than the soft Cu metal, hence some dishing occurs in step one of the CMP. In step two of the CMP, the TiN removal rate is faster than that of Ta/TaN and is comparatively closer to the polishing rate of Cu. Dishing is then removed in step two of the CMP. The TiN and Ta/TaN are removed without any residual film on the top surface areas.

BRIEF DESCRIPTION OF THE DRAWINGS

The object and other advantages of this invention are best described in the preferred embodiments with reference to the attach drawing that include:

FIGS. 1A–1B, which in cross-sectional representation illustrate the method of prior art.

DESCRIPTION OF THE PREFERRED EMBODIMENTS

FIG. 1 illustrates the layers typically used in CMP dual damascene process. The substrate 1 is the semiconductor. Insulating layer 10 is shown with a trench and via pattern. Layer 12 is typically Ta or TaN and acts as a liner for the trench and via cavity. CMP Cu metal 14 is shown with a dished structure below the dotted line of the top surface. embodiments of this invention solve the problem of Cu dishing.

The new and improved method of using CMP to define a dual damascene metal pattern will now be described in detail. This process produces conducting copper metal lines and vias with planar metal without the problem of dishing.

Figure 2:
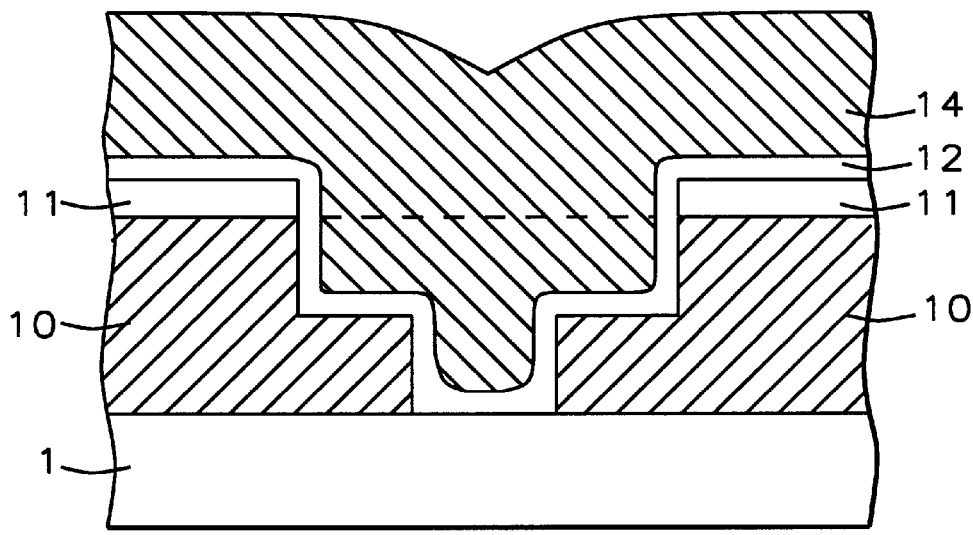
FIG. 2 through 6 schematically illustrate in cross-sectional representation the preferred embodiments of the present invention.

Referring now more particularly to FIG. 2, there is shown a substrate 1, semiconductor or multi-level metal with partially complete cross-section of a conducting line and interconnect. Typically, this substrate can be aluminum or copper metallization scheme. Aluminum can be deposited using CVD or PVD with underlying barrier layer of Ti/TiN and an ARC layer of Ti/TiN. The copper can be deposited using any conventional approach including CVD, PVD, and electroplating.

First the insulating layer, for example, PE TEOS (plasma enhanced tetraethylorthosilicate), silicon oxide, BPSG borophosphosilicate glass, is deposited on the substrate. Typically, PE CVD oxide is used. Process temperatures near 400° C. for deposition and low pressures. Deposition rates of near 5000 Å/min and the thickness of oxide range can be from 4000 Å to 12,000 Å.

Isolation insulating material 10 is shown with the trench and via patterns for dual damascene in place. As part of a buffer layer and the dual CMP barrier layer 11 TiN is shown patterned on top of oxide, outside of the trench/via area. Many photolithographic processes can be employed. The via hole can be ~0.24 μm and the trench can be 0.3 μm to several microns. Aspect ratios can range from 3:1 to 6:1.

Many methods can be used to deposit the TiN, ie, Ti reactively sputtered in $N_2$ ambient, collimated sputtering, CVD, PE CVD and PVD.

The top layer of the dual CMP barrier layer is of Ta or TaN layer 12, which is a blanket layer conformally covering surfaces both inside and out the trench via area. For low film stress, good coverage and good adhesion the preferred method of deposition is the PVD technique.

Next the conducting metal, copper, 14 is shown deposited over the all the layers. The copper layer dips into the trench and vias opens. The copper can be deposited using PVD, CVD, or electroplating. Typically, the copper deposition thickness can range from 1um to several microns.

In the usual method of dual-damascene, the oxide is patterned using two photo lithography masking steps and two RIE steps: one to form the contact vias and then the second to form the conducting line trenches in the insulating oxide. However, in this process a TiN layer and insulating layer are patterned together in the second lithography step.

After the insulating oxide is deposited, a thin layer of TiN, titanium nitride is deposited by PVD in a thickness range from 300 Å to approximately 1000 Å. With process tuning low stress and good adhesion are achieved. The TiN is the first layer of the important dual layer CMP barrier to be deposited and patterned. The TiN is patterned together with the insulating oxide by photo lithography masking steps and etched by RIE.

The TiN is patterned so that the dual-damascene pattern is open in the via holes and open in the trench areas. The TiN is on top of the thick oxide surrounds the recessed areas, those being the trench and via areas.

Next the second layer of the dual CMP barrier layer is deposited. This layer consists of Ta or TaN and is conformally deposited by PVD and in the thickness range of 200 Å to 500 Å.

Next copper metal is deposited by collimated sputter deposition or by CVD for good via and trench fill properties. Copper thickness range is from 10,000 Å to 30,000 Å.

Figure 3:
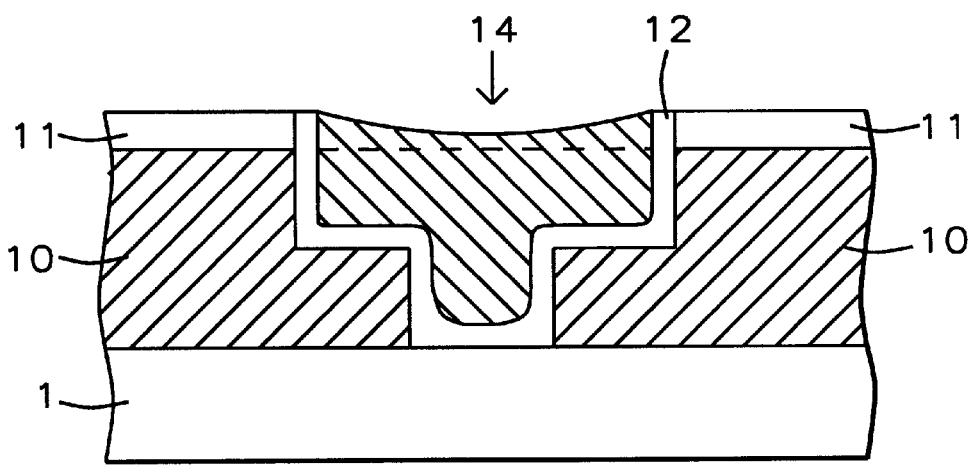

Illustrated in FIG. 3 is the first step in the CMP process in which the first layer of the dual CMP barrier layer is removed along with some of the copper metal. The Ta or TaN layer 12 is polished back to the trench/via area and some dishing of the copper is depicted. The TiN layer 11 is shown intact at this point in the process.

The CMP process uses $Al_2O_3$ based low pH slurry and polyeurathane based pad. Downward force can be 2 psi to 8 psi, with spin speeds of wafer and table of 20 rpm to 100 rpm, with temperature at room temperature. Removal rate of copper is about 5,000 Å/min. Removal rate of TiN/Ti is 3,500 Å/min and removal rate of Ta/TaN is about 1,000 Å/min. It is this faster removal rate of Ti/TiN that gives a dishless surface compared to Ta/TaN.

Figure 4:
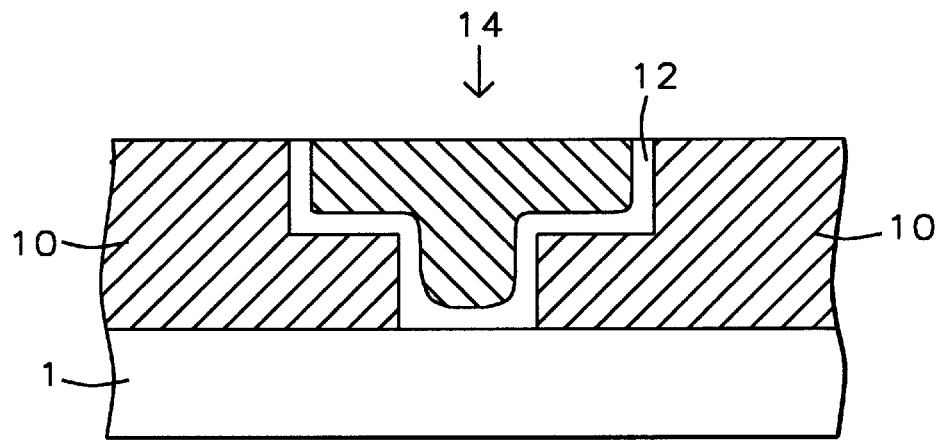

In the final cross-sectional view FIG. 4, the TiN layer having a CMP rate close to copper is removed from the top surface. The Ta or TaN lines the via and trench is aid in containing the copper and the liner acts as a diffusion barrier. The important conducting coppper lines and inter-connects (studs) show no dishing and are not thinned. This is due to two step CMP process and the relatively close polishing rate of the TiN barrier layer to Cu. A Luxtron endpoint controller is used for this process, which detects endpoint due to increased polishing friction based on an increase in drive current.

The process of the present invention avoids thinning of the conducting lines which increase line or wire resistance. Dishing and other non-uniformities across the substrate are eliminated. These improvements are brought about by the use of a dual CMP barrier layer and thereby a two step CMP process. Dishing is eliminated in the second CMP step by using a combination of Ta or TaN top layer and a buffer layer of TiN, as the final barrier layer. By this process these barrier layers are completely removed from the top active surface. The Ta or TaN is left behind as a tench/via liner, to act a diffusion barrier for copper.

Figure 5:
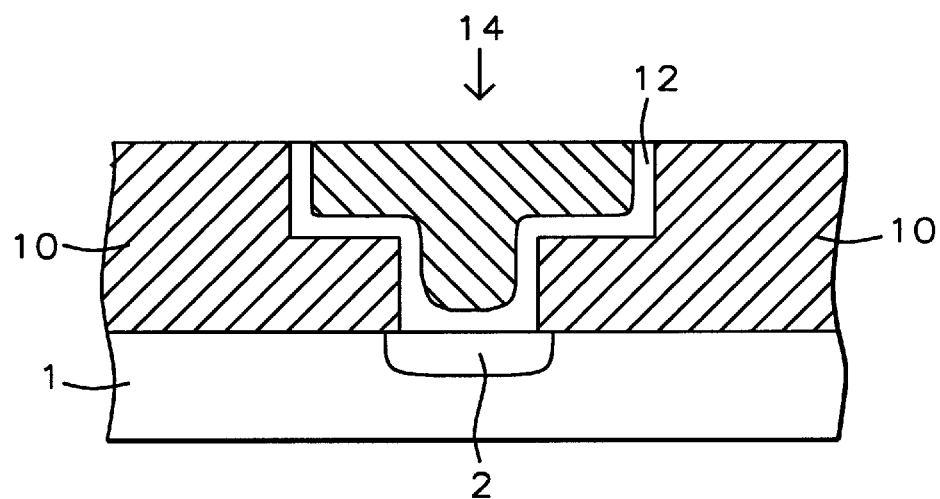
Figure 6:
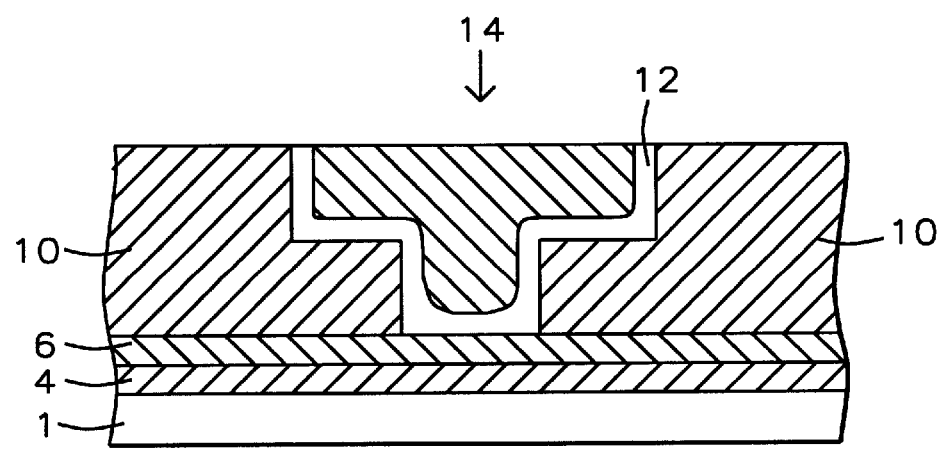

FIG. 5 and FIG. 6 show two applications of the present invention. Only the specific areas unique to the understanding of this invention will be described in detail. FIG. 5 shows a semiconductor substrate 1 with a diffusion area 2 being contacted by trench and via 14. FIG. 6 shows another general application whereby the trench and via 14 contact a multi-level conducting metal line 6, which is on a ILD, interlevel dielectric layer 4 on a semiconductor substrate 1.

While the invention has been particularly shown and described with reference to the preferred embodiments thereof, it will be understood by those skilled in the art that various changes in the form and details may be made without departing from the spirit and scope of the invention.

What is claimed is:

1. A method of forming conducting metal lines and interconnects (studs) in trenches and vias in the fabrication of integrated circuit devices that forms CMP planarized structure without dishing comprising:

providing a substrate having an insulator layer deposited upon said substrate;

depositing a layer of first material upon the insulator layer;

providing patterning and etching of the first material and insulator layer to form via holes for interconnects;

providing patterning and etching of the first material and insulator layer to form trenches for conducting lines;

blanket depositing a conformal layer of second material above the patterned layer of the first material and insulator layer;

providing with the second material a covering or lining of the trench and via structures;

depositing a blanket conducting metal over the entire substrate filling the open trench and via structures;

chemical-mechanical polishing the conducting metal layer in a two-step process;

a first step of polishing back both top metal layer with the second material layer, said second material layer being harder than the conducting metal;

further chemical-mechanical polishing back both top metal layer with the first material layer, said first material layer being soft material and close to the conducting metal in polishing rate, to form planarized conducting metal line and interconnect structures, without dishing; and removing in said two step process all the residual first material and leaving second layer material as a liner and diffusion barrier in the trench/via structures.

2. The method of claim 1, wherein said insulating oxide layer is silicon oxide, deposited by the method of PE deposited TEOS oxide in the thickness range from 4,000 Å to 12,000 Å.

3. The method of claim 1, wherein said layer of first material is TiN, deposited by PVD in a thickness range from 300 Å to 1,000 Å.

4. The method of claim 1, wherein said layer of second material is Ta/TaN, deposited by PVD in a thickness range from 200 Å to 500 Å.

5. The method of claim 1, wherein said layer of top conducting metal is copper, deposited by CVD in a thickness range from 10,000 Å to 30,000 Å.

6. The method of claim 1, wherein said thin films of TiN, Ta, and TaN are deposited by CVD.

7. A method of claim 1, wherein TiN layer polishing properties have a faster removal rate than Ta or TaN.

8. The method of claim 1, wherein the material Ta or TaN has a slower polishing rate than copper.

9. The method of claim 1, wherein TiN forms a buffer layer for Ta or TaN.

10. The method of claim 1, wherein a combination of Ta/TaN forms a dual layer with TiN and acts as a polishing barrier to yield planar copper structures.

11. The method of claim 1, using the dual layers of TiN, Ta/TaN in a damascene process that planarizes Cu lines and interconnects using CMP, with built-in polishing stop at the insulating material surface.

12. The method of claim 1, wherein the dual layers combined action: TiN polishing being close that of Cu, Ta or TaN a harder material and polishes at slower rate than the soft copper, planarize the surface.

13. A method of using the dual damascene technique to form, a conductive contact to a semiconductor diffusion and interconnection wiring pattern, in the fabrication of an MOSFET that form CMP planarized structures without dishing comprising:

providing said active device element in an semiconductor substrate;

providing a semiconductor substrate having an insulator layer deposited upon said semiconductor substrate;

depositing a layer of first material upon the insulator layer;

providing patterning and etching of the first material and insulator layer to form via holes for interconnects;

providing patterning and etching of the first material and insulator layer to form trenches for conducting lines;

blanket depositing a conformal layer of second material above the patterned layer of the first material and insulator layer;

providing with the second material a covering or lining of the trench and via structures;

depositing a blanket conducting metal over the entire substrate filling the open trench and via structures;

chemical-mechanical polishing the conducting metal layer in a two-step process;

a first step of polishing back both top metal layer with the second material layer, said second material layer being harder than the conducting metal;

further chemical-mechanical polishing back both top metal layer with the first material layer, said first material layer being soft material and close to the conducting metal in polishing rate, to form planarized conducting metal line and interconnect structures, without dishing; and removing in said two-step process all the residual first material and leaving second layer material as a liner and diffusion barrier in the trench and semiconductor diffusion contact area.

14. The method of claim 13, wherein the contact is made to a diffusion area of an MOSFET on a semiconductor substrate.

15. A method of using a dual damascene technique to form a conductive contact to a multi-level metal line and interconnection wiring pattern, in the fabrication semiconductor devices that forms CMP planarize structures without dishing comprising:

providing said conducting line on an interlevel dielectric, which is on a semiconductor substrate;

depositing an insulator layer upon the conducting line;

depositing a layer of first material upon the insulator layer;

providing patterning and etching of the first material and insulator layer to form via holes for interconnects;

providing patterning and etching of the first material and insulator layer to form trenches for conducting lines;

blanket depositing a conformal layer of second material above the patterned layer of the first material and insulator layer, and thus;

providing with the second material a covering or lining of the trench and via structures;

depositing a blanket conducting metal over the entire substrate filling the open trench and via structures;

chemical-mechanical polishing the conducting metal layer in a two-step process;

a first step of polishing back both top metal layer with the second material layer, said second material layer being harder than the conducting metal;

further chemical-mechanical polishing back both top metal layer with the first material layer, said first material layer being soft material and close to the conducting metal in polishing rate, to form planarized conducting metal line and interconnect structures, without dishing;

removing in said two-step process all the residual first material and leaving second layer material as a liner and diffusion barrier in the trench and interconnect structure.

16. The method of claim 15, wherein a dual damascene process with dual layer CMP barrier layer is used, contact is made to a conducting line in a multi-level metal connection structure on a semi-conductor substrate.

\* \* \* \* \*

UNITED STATES PATENT AND TRADEMARK OFFICE
CERTIFICATE OF CORRECTION

PATENT NO. : 6,004,188
DATED : December 21, 1999
INVENTOR(S) : Sudipto Ranendra Roy It is certified that error appears in the above-identified patent and that said Letters Patent is hereby corrected as shown below:

On the Cover Page, at (75), delete "Spring Grove", and replace with --Singapore--; so that the Inventor's name and residence reads; Sudipto Ranendra Roy, Singapore, Singapore.

Signed and Sealed this

First Day of May, 2001

Attest:

NICHOLAS P. GODICI

Attesting Officer    Acting Director of the United States Patent and Trademark Office